(12) United States Patent
Kurokawa et al.

(10) Patent No.: US 6,627,037 B1
(45) Date of Patent: Sep. 30, 2003

(54) METHOD OF DETACHING ARTICLE FIXED THROUGH PRESSURE SENSITIVE ADHESIVE DOUBLE COATED SHEET

(75) Inventors: Shuji Kurokawa, Ageo (JP); Kenji Kobayashi, Omiya (JP)

(73) Assignee: Lintec Corporation, Tokyo (JP)

( * ) Notice: Subject to any disclaimer, the term of this patent is extended or adjusted under 35 U.S.C. 154(b) by 111 days.

(21) Appl. No.: 09/595,809

(22) Filed: Jun. 16, 2000

(30) Foreign Application Priority Data

Jun. 17, 1999 (JP) .......................................... 11-170925

(51) Int. Cl.$^7$ .............................................. B32B 35/00
(52) U.S. Cl. ....................................... 156/344; 156/584
(58) Field of Search ................................. 156/344, 584, 156/247, 84, 272.2, 275.5, 275.7, 379.6, 499, 580, 583.1

(56) References Cited

U.S. PATENT DOCUMENTS

| | | | |
|---|---|---|---|
| 5,447,596 A | * | 9/1995 | Hayase ........................ 156/584 |
| 5,476,566 A | * | 12/1995 | Cavasin ....................... 156/154 |
| 5,534,102 A | * | 7/1996 | Kadono et al. ............. 156/250 |
| 5,587,096 A | * | 12/1996 | Huvard et al. .............. 219/521 |
| 6,007,920 A | * | 12/1999 | Umehara et al. ......... 428/473.5 |
| 6,176,966 B1 | * | 1/2001 | Tsujimoto et al. .......... 156/344 |
| 6,263,941 B1 | * | 7/2001 | Bryan et al. ................ 156/239 |

FOREIGN PATENT DOCUMENTS

| | | |
|---|---|---|
| EP | 0 308 216 A1 | 9/1988 |
| EP | 0 884 766 A2 | 12/1998 |
| GB | 2340772 | 3/2000 |
| JP | 59-171137 A | 9/1984 |
| JP | 63-021846 A | 7/1986 |
| JP | 07-304560 A | 11/1995 |
| JP | 10-060391 A | 3/1998 |
| JP | 11109806 | 4/1999 |

* cited by examiner

Primary Examiner—Richard Crispino
Assistant Examiner—Cheryl N. Hawkins
(74) Attorney, Agent, or Firm—Webb Ziesenheim Logsdon Orkin & Hanson, P.C.

(57) ABSTRACT

Laminate unit C obtained by fixing article B to support plate A through pressure sensitive adhesive double coated sheet 1 capable of being deformed by heating to thereby exert a detachment effect is held between a pair of sandwiching means, the sandwiching means so arranged as to enable interposition of the laminate unit C. The laminate unit C is heated by heating means 7 so that the pressure sensitive adhesive double coated sheet 1 is deformed to thereby reduce an area of contact of the pressure sensitive adhesive double coated sheet 1 with the article B with the result that the article B comes up from the pressure sensitive adhesive double coated sheet 1. Thereafter, the article B is detached from the pressure sensitive adhesive double coated sheet 1. Thus, there can be provided method of detaching an article fixed through a pressure sensitive adhesive double coated sheet and a detachment apparatus therefor, which realize effective detachment of articles and ensure suitability to processing by an automatic line.

3 Claims, 10 Drawing Sheets

METHOD OF DETACHING ARTICLE FIXED THROUGH PRESSURE SENSITIVE ADHESIVE DOUBLE COATED SHEET

FIELD OF THE INVENTION

The present invention relates to a method of detaching an article fixed through a pressure sensitive adhesive double coated sheet and a detachment apparatus.

BACKGROUND OF THE INVENTION

For example, a semiconductor wafer such as silicon is produced in the form of a disc of large diameter. A circuit pattern is formed on a surface of the semiconductor wafer, and the back thereof is ground.

In recent years, there is a demand for the reduction of the thickness of semiconductor chips for IC cards and the like. It is necessary to reduce the thickness of semiconductor chips produced from the semiconductor wafer, which has conventionally been 300–400 $\mu$m, to about 100–50 $\mu$m. In this case, a pressure sensitive adhesive sheet, which is used for fixing the semiconductor wafer to a table and the like while protecting the surface of the semiconductor wafer furnished with a circuit pattern, is produced by coating a soft base material with a pressure sensitive adhesive.

It is extremely difficult to grind the semiconductor wafer to a thickness as small as about 50 $\mu$m with the use of such a soft pressure sensitive adhesive sheet. When the conventional pressure sensitive adhesive sheet is stuck to the wafer, it has been experienced that the tension applied at the time of sticking is accumulated as a residual stress. As a result, in the event that the diameter of the wafer is large or grinding to an extremely small thickness is intended, the residual stress of the pressure sensitive adhesive sheet is greater than the strength of the wafer. Therefore, a force for canceling the residual stress is brought about to cause the wafer to suffer from a warpage. Moreover, it has been experienced that, in the use of the soft base material, the wafer is broken during the transportation because the wafer is brittle after the grinding.

Also, it is practiced to fix the semiconductor wafer to a support plate such as a glass plate, a quartz plate or an acrylic plate with the use of a wax in place of the pressure sensitive adhesive sheet comprising a soft base and to thereafter effect grinding thereof. In this method, it is difficult to apply the wax at a uniform thickness. Moreover, after the completion of the grinding, the wax must be washed away with, for example, an organic solvent, the washing being time-consuming work. Further, thereafter in the event of dicing into small squares, it is required to stick a dicing tape to the wafer having been freed of the wax, this sticking causing an additional workload. Therefore, the use of the wax is not suitable to the processing of electronic components by an automatic line. Moreover, in the sticking of the semiconductor wafer to a support plate such as a glass plate with the use of a wax as well, it is difficult to detach them from each other at a later stage, so that breakage cannot be avoided.

In these circumstances, the applicant has proposed a pressure sensitive adhesive double coated sheet which fixes the wafer to a support plate in place of the wax and which can easily be detached from the wafer.

The present invention provides a method of detaching an article fixed through a pressure sensitive adhesive double coated sheet and a detachment apparatus therefor, which, by virtue of the use of the above pressure sensitive adhesive double coated sheet, realize effective detachment of articles and ensure suitability to processing by an automatic line.

SUMMARY OF THE INVENTION

The method of detaching an article fixed through a pressure sensitive adhesive double coated sheet according to the present invention comprises the steps of:

holding a laminate unit, between a pair of sandwiching means, the sandwiching means so arranged as to enable interposition of the laminate unit, said laminate unit being obtained by fixing an article to a support plate through a pressure sensitive adhesive double coated sheet capable of being deformed by heating to thereby exert a detachment effect;

heating the laminate unit by heating means so that the pressure sensitive adhesive double coated sheet is deformed to thereby reduce an area of contact between the pressure sensitive adhesive double coated sheet and the article, with the result that the article is apart from the pressure sensitive adhesive double coated sheet.

In this method, the pressure sensitive adhesive double coated sheet is deformed by heating, so that the pressure sensitive adhesive double coated sheet stuck to the article can be detached easily from the article.

Preferably, the pair of sandwiching means comprises a first table and a second table.

The detaching method of the present invention is preferably characterized in that the pair of sandwiching means are held so as to enable providing therebetween such a clearance that the deformation of the pressure sensitive adhesive double coated sheet is not prevented by the sandwiching means.

In this case, the pressure sensitive adhesive double coated sheet is shrunk, and, when the pressure sensitive adhesive double coated sheet is curved in the direction of the thickness thereof, the article can easily be detached from the pressure sensitive adhesive double coated sheet.

Further, in the present invention, it is preferred that the pressure sensitive adhesive of at least one side of the pressure sensitive adhesive double coated sheet is composed of an ultraviolet curable pressure sensitive adhesive, with the support plate permeable for ultraviolet rays, and that, prior to holding the laminate unit between the sandwiching means, the pressure sensitive adhesive double coated sheet is irradiated with ultraviolet rays having been passed through the support plate, so that the ultraviolet curable pressure sensitive adhesive has its adhesive strength reduced.

In the employment of this construction, the adhesive strength is reduced prior to the deformation of the pressure sensitive adhesive double coated sheet, so that the deformation can be easily accomplished.

In another aspect of the present invention, there is provided a detachment apparatus for detaching an article (article) fixed through a pressure sensitive adhesive double coated sheet, intended to detach an article fixed to a support plate through a pressure sensitive adhesive double coated sheet capable of being deformed by heating to thereby exert a detachment effect, comprising:

a pair of sandwiching means arranged so as to enable interposition therebetween, and heating means for deforming the pressure sensitive adhesive double coated sheet.

Preferably, the pair of sandwiching means comprises a first table capable of fixing the support plate side by suction and a second table capable of fixing the article side by suction.

It is also preferred that the pair of sandwiching means are held so as to enable providing therebetween such a clearance that the deformation of the pressure sensitive adhesive double coated sheet is not blocked by the sandwiching means.

The detachment apparatus preferably further comprises an ultraviolet irradiation device capable of irradiating the pressure sensitive adhesive double coated sheet with ultraviolet rays so that the pressure sensitive adhesive double coated sheet has its adhesive strength reduced.

Moreover, the detachment apparatus preferably further comprises means for removing residues of the pressure sensitive adhesive double coated sheet.

With the use of the above detachment apparatus of the present invention, the pressure sensitive adhesive double coated sheet is deformed by heating so that the deformed pressure sensitive adhesive double coated sheet can be detached with enhanced reliability without damaging the article.

DETAILED DESCRIPTION OF THE INVENTION

The method of detaching an article fixed through a pressure sensitive adhesive double coated sheet and the detachment apparatus according to the present invention will be described below with reference to the drawings.

Figure 1:
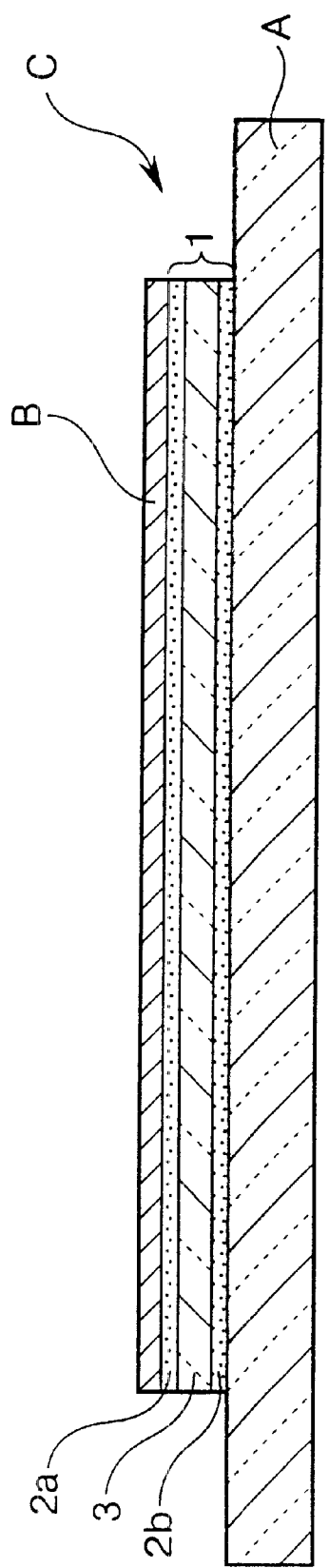
FIG. 1 is a sectional view of a laminate unit for use in one embodiment of the present invention.

FIG. 1 shows laminate unit C for use in this embodiment.

The laminate unit C comprises pressure sensitive adhesive double coated sheet 1, support plate A stuck to one side thereof, and article B stuck to the opposite side thereof.

In this embodiment, a chipped semiconductor wafer is used as the article B. However, the article B for use in the present invention is not limited thereto, and any of ceramic- or resin-made insulating substrates, optical elements such as quartz and glass plates for various electronic components and composites thereof can be used as the article B as long as these are in the form of a plate.

The pressure sensitive adhesive double coated sheet 1 for use in this embodiment comprises heat shrink base material 3 and pressure sensitive adhesive layers 2a,2b formed on both sides of the base material. Although any of common pressure sensitive adhesives can be used in the pressure sensitive adhesive layers 2a,2b, it is preferred that at least one of the pressure sensitive adhesive layers 2a,2b is composed of an ultraviolet curable pressure sensitive adhesive. In this embodiment, both of the pressure sensitive adhesive layers 2a,2b are composed of an ultraviolet curable pressure sensitive adhesive.

With respect to the detail of this pressure sensitive adhesive double coated sheet, reference is made to Japanese Patent Application No. 11(1999)-109806. The pressure sensitive adhesive double coated sheet 1 for use in the present invention is not limited to that of this embodiment. For example, it may be a pressure sensitive adhesive double coated sheet whose pressure sensitive adhesive contains a heat foaming agent so that foaming occurs upon heating to result in deformation of the pressure sensitive adhesive layers.

The support plate A is composed of a hard plate. When one of the pressure sensitive adhesive layers 2a,2b is composed of an ultraviolet curable pressure sensitive adhesive, a hard glass plate or plastic plate produced from a material permeable for ultraviolet rays can preferably be used as the support plate A. It is preferred that the pressure sensitive adhesive double coated sheet 1, the support plate A and the article B have substantially the same shape.

The detachment apparatus of this embodiment will now be described.

Figure 2:
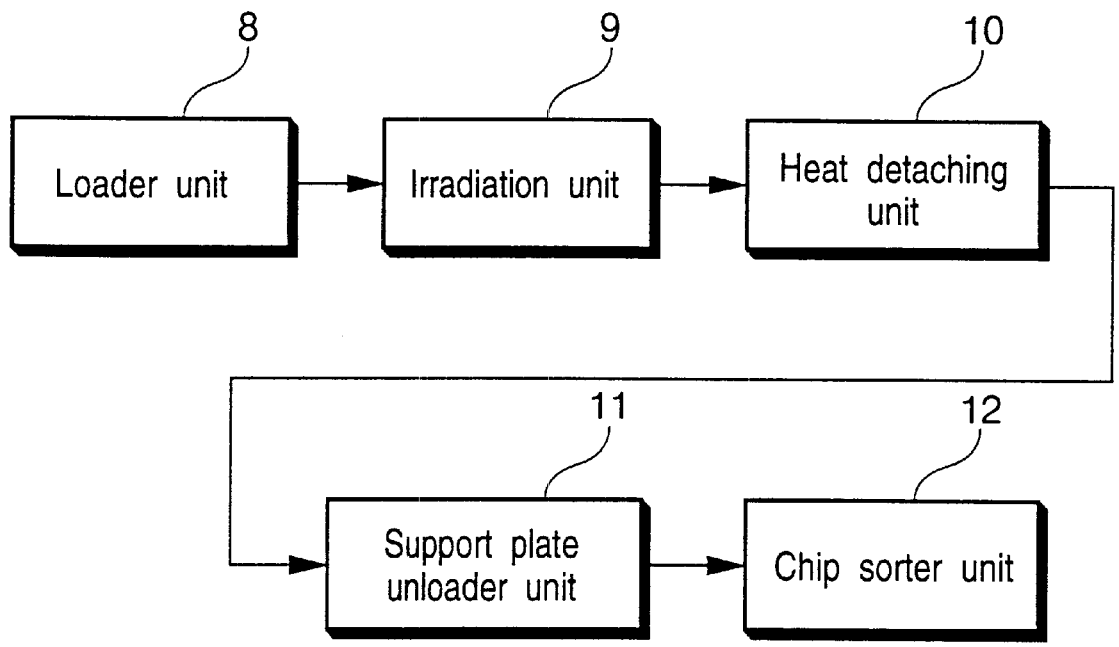
FIG. 2 is an explanatory view of a detachment apparatus according to one embodiment of the present invention.
Figure 3:
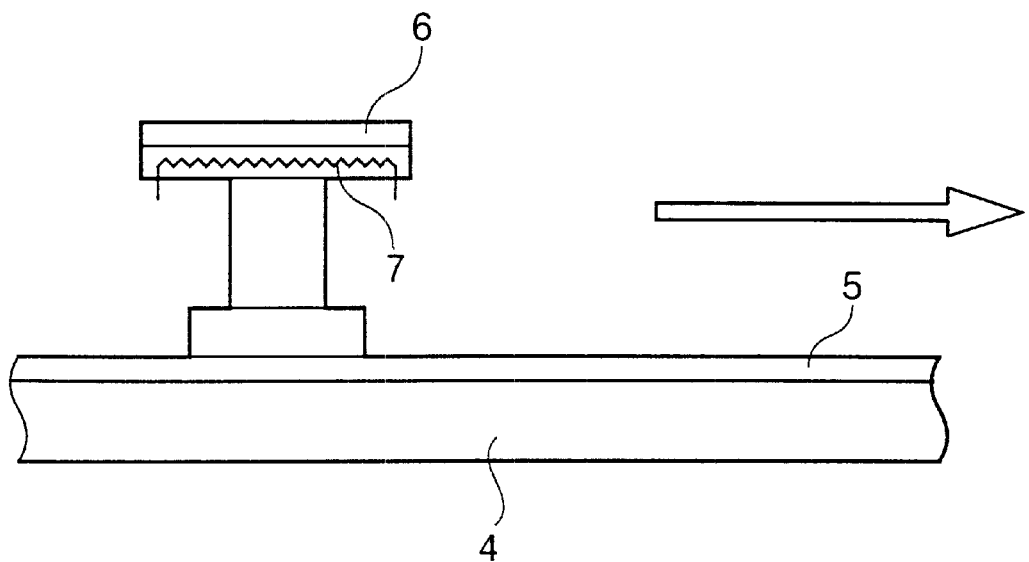
FIG. 3 is a schematic side view of a second table employed in a detachment apparatus according to one embodiment of the present invention.

Referring to FIG. 2, the detachment apparatus of this embodiment can be divided into loader unit 8, irradiation unit 9, heat detaching unit 10, support plate unloader unit 11 and chip sorter unit 12 and these units arranged in series on a line. As shown in FIG. 3, base board 4 constituting a foundation of the whole apparatus is disposed so as to extend under all these units. Lengthy slide rail 5 is mounted on the base board 4. Second table 6 constituting one of a pair of sandwiching means of the present invention is slidably fitted on the slide rail 5. The second table 6 can be moved to and stopped at any predetermined position of the loader unit 8, irradiation unit 9, heat detaching unit 10, support plate unloader unit 11 and chip sorter unit 12 by means of a driving means and a position sensor (both not shown). The second table 6 has its upper surface provided with minute through holes, which are connected to a valve and a vacuum pump (both not shown), so that the upper surface becomes a sucking means capable of fixing a plate article by suction. Heating means 7 is disposed under the sucking means, so that the article fixed on the upper surface of the second table 6 can be heated. The heating means 7 is not particularly limited and, for example, can be any of conventional heating means such as a sheathed wire heater and a rubber heater.

Figure 4:
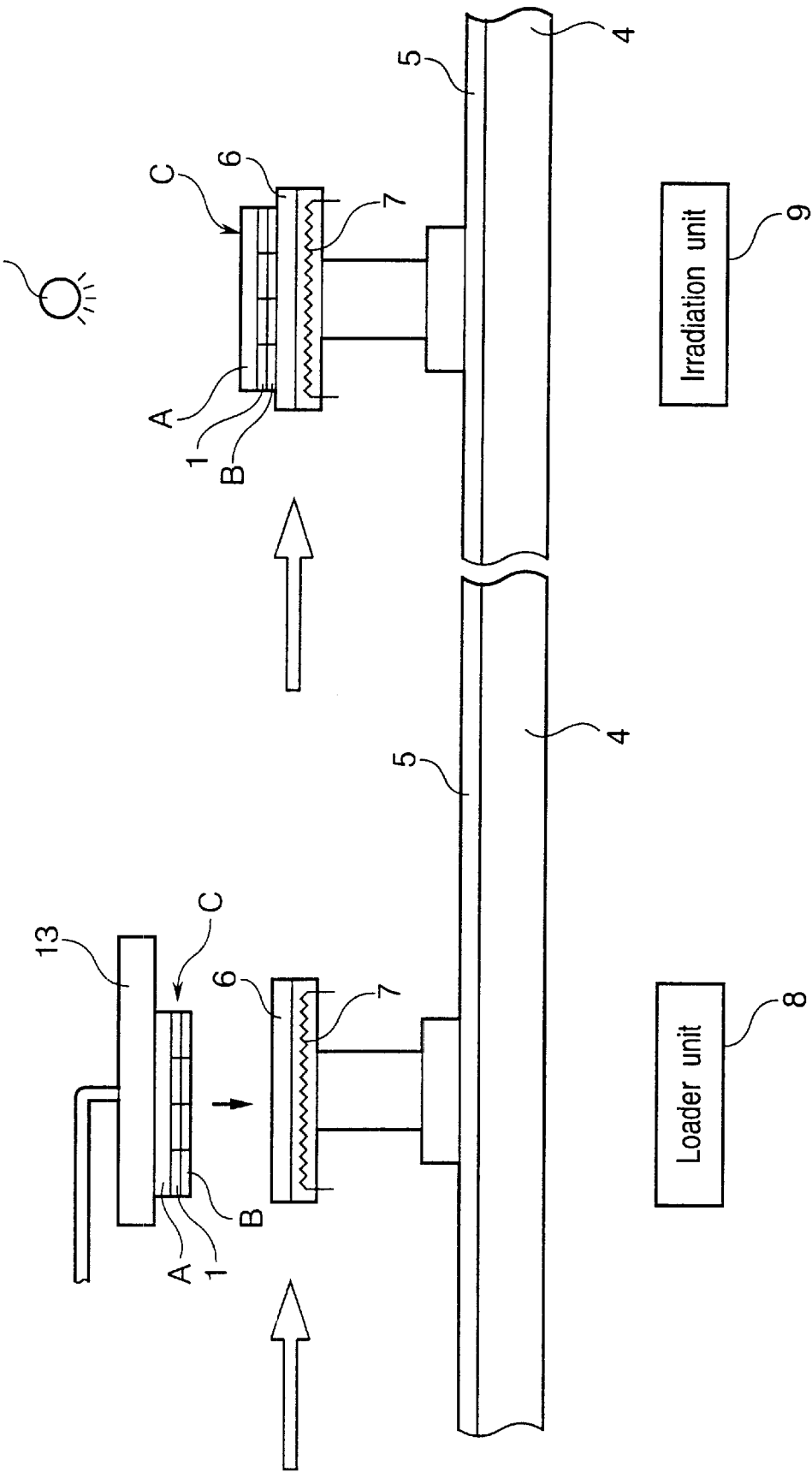
FIG. 4 is a schematic side view of a loader unit and an irradiation unit incorporated in a detachment apparatus according to one embodiment of the present invention.

FIG. 4 shows the loader unit 8 and the irradiation unit 9. The loader unit 8 includes a cassette storing a laminate unit (not shown) and carrying arm 13 capable of carrying the laminate unit C from the cassette storing the laminate unit by applying a negative pressure, for example by suction.

In the irradiation unit 9, an ultraviolet lamp 20 such as a high-pressure mercury lamp is arranged at an upper part thereof in such a manner that ultraviolet rays can be irradiated toward the slide rail 5 on which the second table 6 travels.

Figure 5:
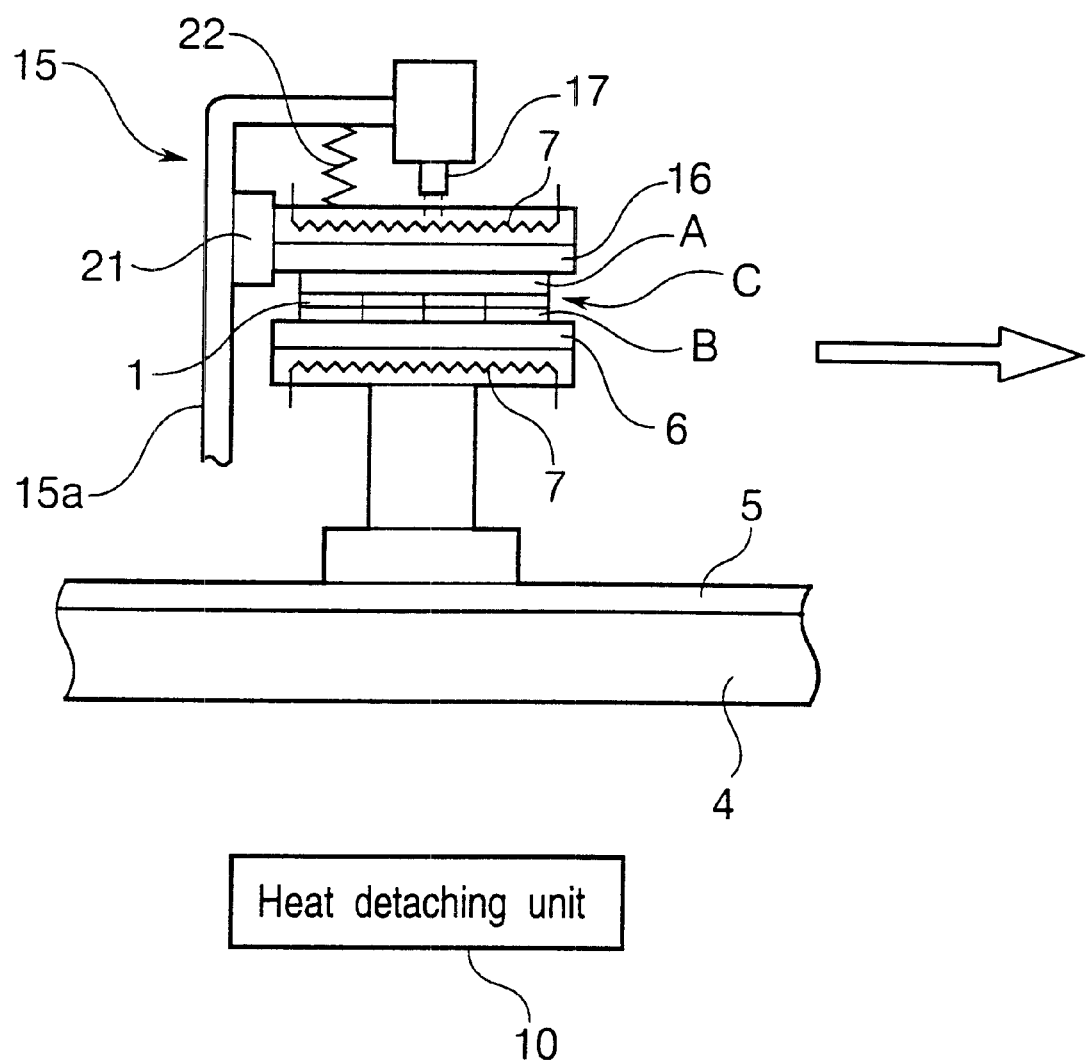
FIG. 5 is a schematic side view of a heat detaching unit incorporated in a detachment apparatus according to one embodiment of the present invention.

The heat detaching unit 10 is shown in FIG. 5.

In the heat detaching unit 10, inverted-L shaped mounting pillar 15a is fitted onto the base board 4. First table 16 constituting the other of the pair of sandwiching means of the present invention is secured through slider 21 to a vertical part of the mounting pillar 15a in such a manner that the first table 16 is slidable in the vertical direction. A horizontal part of the mounting pillar 15a is fitted with downward rod 17. The distal end of the rod 17 is provided with gripping means capable of gripping the first table 16. When the rod 17 is extended or contracted with the gripping means held in the gripping state, the first table 16 is moved in the vertical direction. When the gripping is canceled, the first table 16 is not influenced by the movement of the rod 17. Spring 22 is provided between the first table 16 and the horizontal part of the mounting pillar 15a. When the first table 16 is positioned downwards, the spring 22 is elongated so that an upward tensile strength applies. The spring 22 is so adjusted that, in the elongated state, the tensile strength nearly balances the gravity of the first table 16. As a result, when the pressure sensitive adhesive double coated sheet 1 is deformed, the gravity of the first table 16 does not prevent the deformation. The spring 22 may be replaced by a dead weight which balances the first table 16. Namely, the dead weight is connected through a pulley to the first table 16 so that balancing is attained.

A lower surface of the first table 16 is provided with the same sucking means as in the above second table 6, and heating means 7 is disposed upside the sucking means.

In this embodiment, the pair of sandwiching means consist of the two tables arranged so as to permit interposition therebetween. However, if the article and support plate have spherical or other irregular shape, not platelike, the configuration of the pair of sandwiching means can conform to the irregular shape thereof. Further, in this embodiment, both the first table and the second table are provided with the heating means 7. However, instead, the heating means 7 can be provided in only one of them, or can be replaced by a dryer arranged beside the tables in such a manner that hot air is blown over the pressure sensitive adhesive double coated sheet 1.

Figure 11:
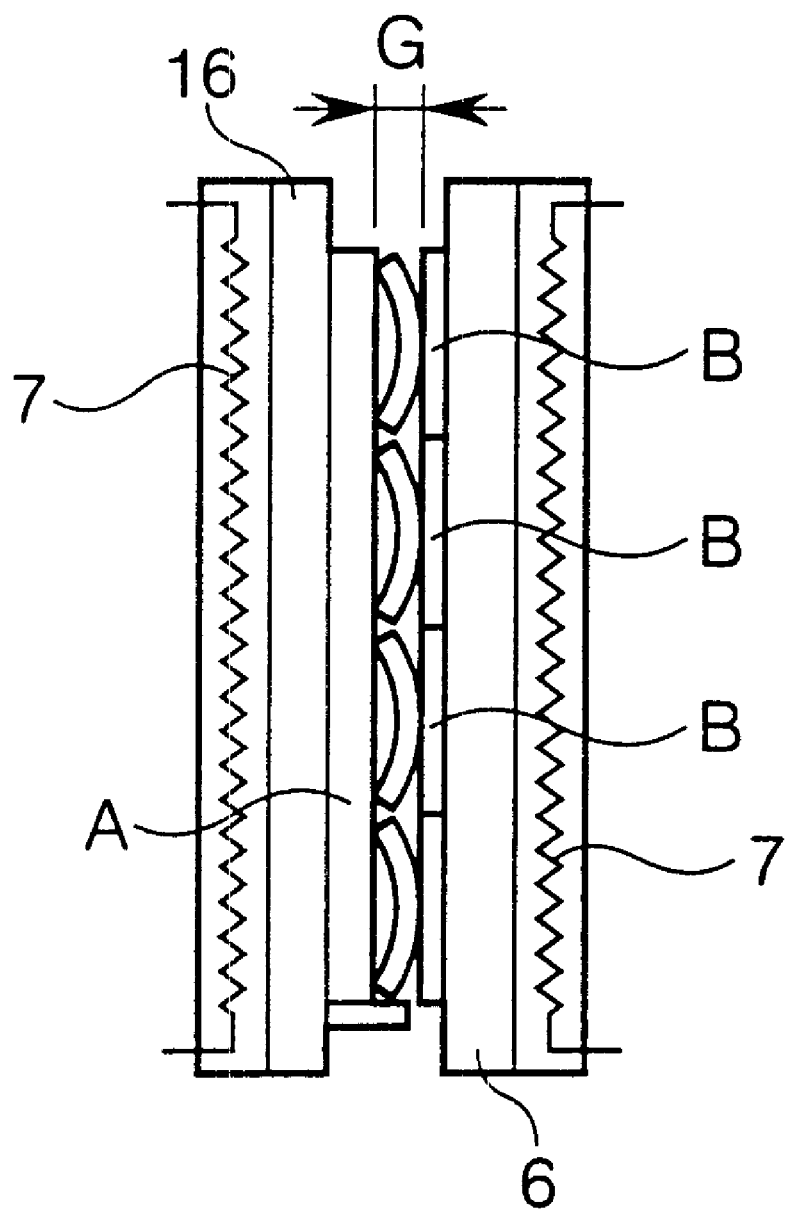
FIG. 11 is an explanatory view of a detachment apparatus according to another embodiment of the present invention.

Still further, in this embodiment, the heat detaching unit 10 is so constructed that the first table 16, the laminate unit C and the second table 6 are held in the state of being piled one upon another in the vertical direction. However, instead, the heat detaching unit 10 can be so constructed that the first table 16, the laminate unit C and the second table 6 are held in the state of standing erect in a horizontal line as shown in FIG. 11. In this construction, the gravities of the members do not influence each other, so that the spring 22 employed as deformation tolerating means in the above embodiment can be avoided. Further, the disposal of residues of the pressure sensitive adhesive double coated sheet 1 can be simplified by the employment of this construction.

Figure 6:
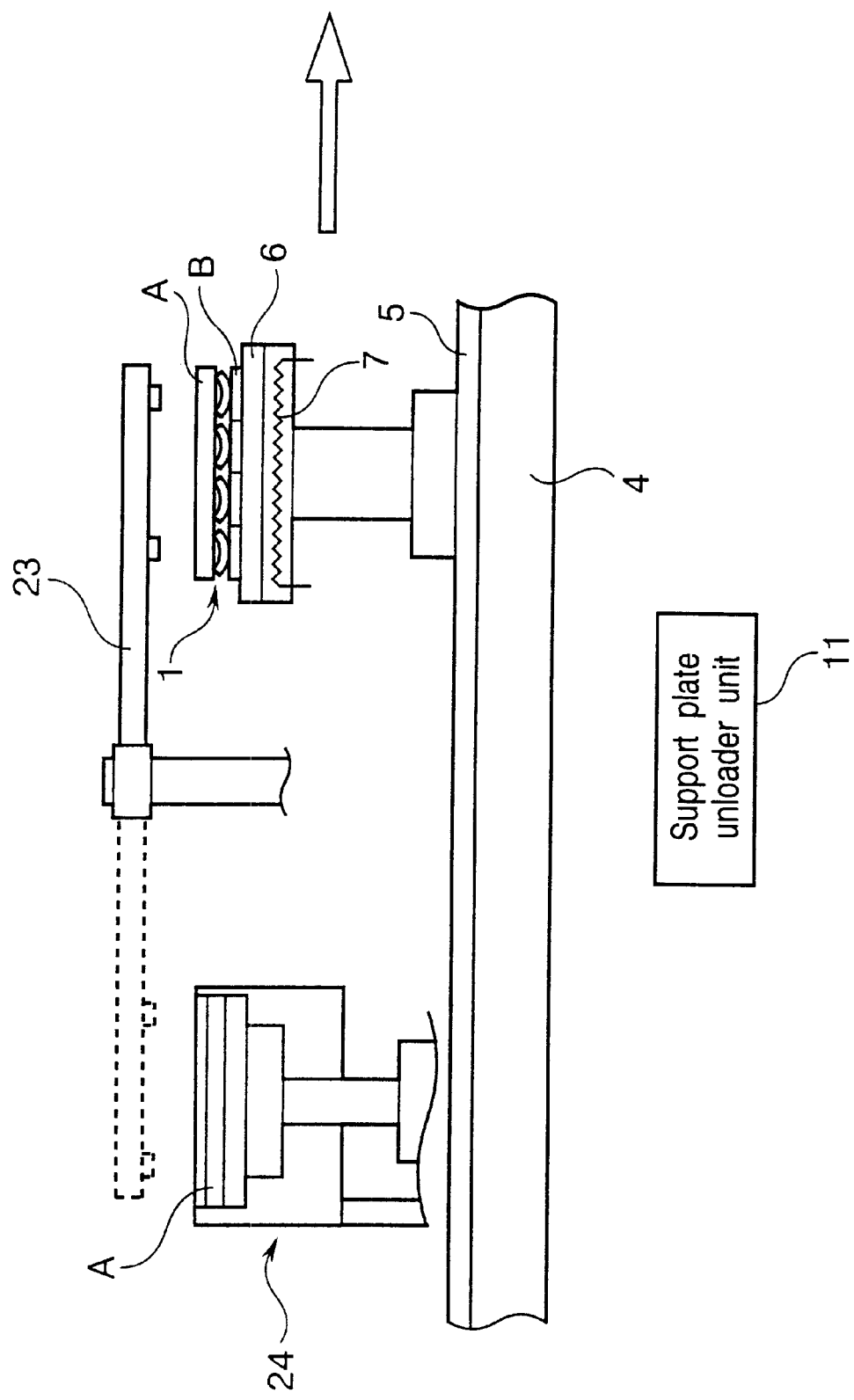
FIG. 6 is a schematic side view of a support plate unloader unit incorporated in a detachment apparatus according to one embodiment of the present invention.

The support plate unloader unit 11 is shown in FIG. 6.

Figure 7:
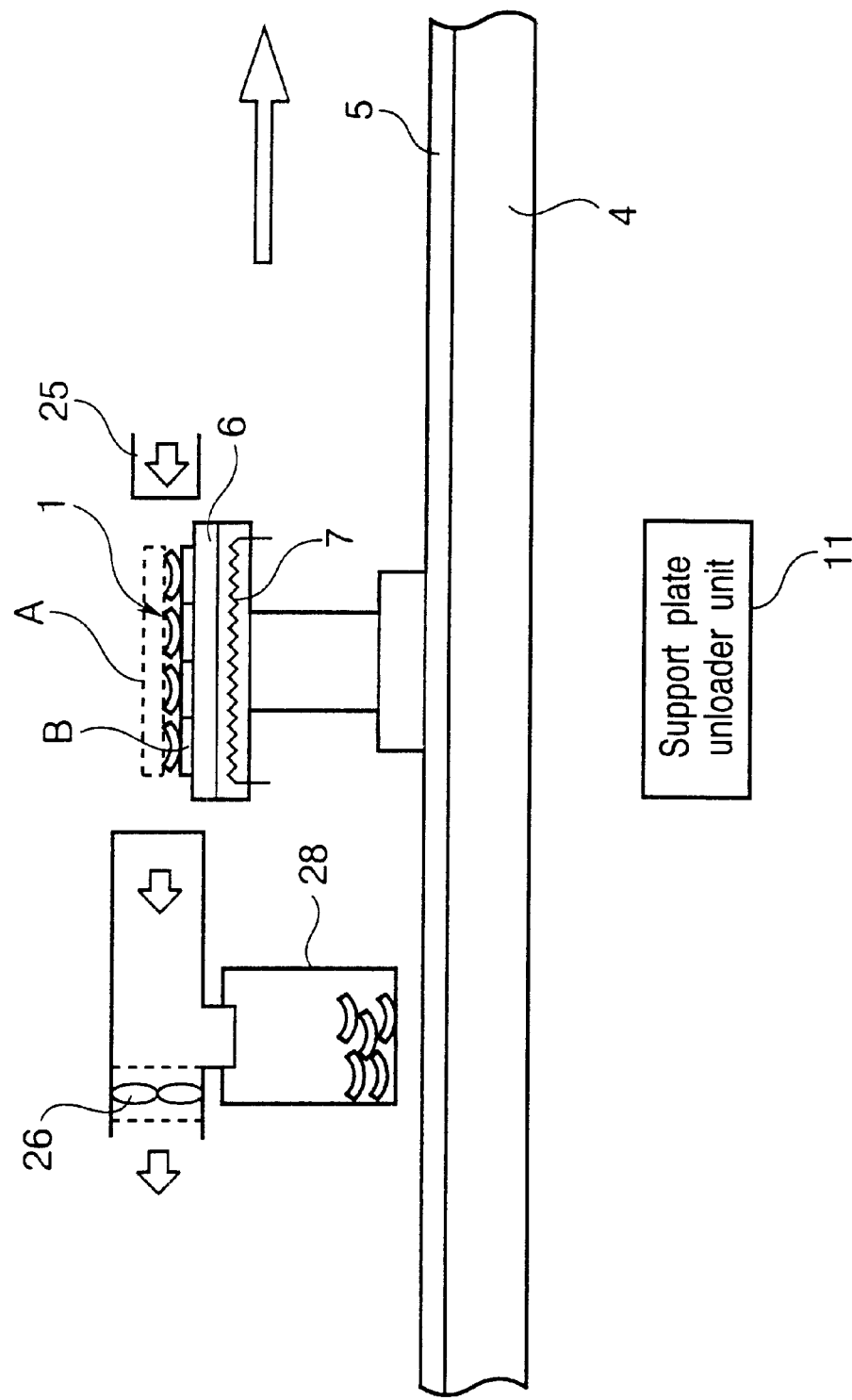
FIG. 7 is a schematic side view of another part of a support plate unloader unit incorporated in a detachment apparatus according to one embodiment of the present invention.

The support plate unloader unit 11 includes support plate cassette 24 which stores detached and discharged support plate A and carrying arm 23 which holds support plate A by suction and carries it from the second table 6 to the support plate cassette 24. In the support plate unloader unit 11, as shown in FIG. 7, ionizer 25 is disposed beside the second table 6. The opposite side thereof is disposed with suction fan 26, and dust box 28 is arranged under the suction fan 26. Ionized wind is blown from the ionizer 25 toward the second table 6. Thus, means for removing residues of the pressure sensitive adhesive double coated sheet 1 is constructed.

Figure 8:
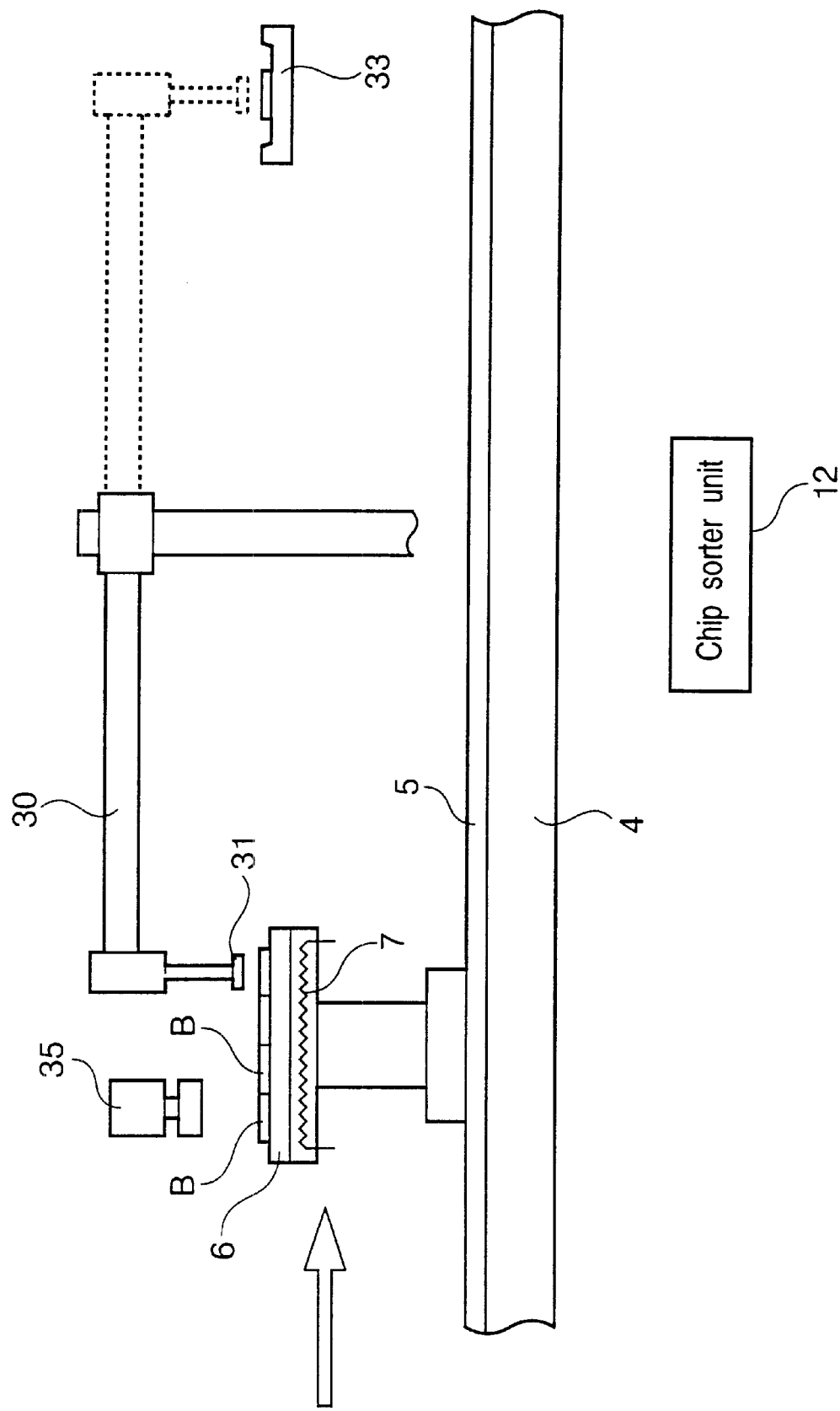
FIG. 8 is a schematic side view of a chip sorter unit incorporated in a detachment apparatus according to one embodiment of the present invention.

The chip sorter unit 12 is shown in FIG. 8.

The chip sorter unit 12 includes a chip tray table (not shown) on which chip tray 33 is placed, pickup arm 30 which reciprocates between the chip tray table and the second table 6, suction collet 31 disposed at the distal end of the pickup arm 30, and position camera 35 for recognizing the position of each chip on an individual basis.

The method of detaching an article with the use of the detachment apparatus of this embodiment and the function thereof will be described.

In this embodiment, the laminate unit C is formed through several prior steps. Specifically, the prior steps of this embodiment includes the step of sticking a semiconductor wafer and a glass plate (support plate A) together with the use of a pressure sensitive adhesive double coated sheet, the back grinding step wherein the semiconductor wafer is ground to a given thickness and the dicing step in which the semiconductor wafer is divided into individual chips. Therefore, in this embodiment, the article B is a semiconductor wafer having been divided into individual chips.

The laminate unit C is stored in the laminate unit storage cassette at the stage prior to this embodiment and placed in a given position of the detachment apparatus of this embodiment to thereby start the detaching operation.

Initially, the second table 6 is moved to an initial position of the loader unit 8. The carrying arm 13 attracts by suction the glass plate A side of the laminate unit C stored in the laminate unit storage cassette, and carries the laminate unit C so as to position above the second table 6. As shown in FIG. 4, the carrying arm 13 mounts the laminate unit C on the second table 6 so that the chip B side of the laminate unit C faces the second table 6, and cancels the suction and retreats. Upon mounting of the laminate unit C on the second table 6, the sucking means of the second table 6 works so that the laminate unit C is fixed on the second table 6.

Subsequently, the second table 6 is slid on the slide rail 5 toward the irradiation unit 9 as shown in FIG. 4. The second table 6 is passed under the ultraviolet lamp 20 provided in the irradiation unit 9 over a given period of time. As a result, the pressure sensitive adhesive double coated sheet 1 is irradiated with ultraviolet rays through the glass plate A so that the adhesive strength of the pressure sensitive adhesive layers provided at both sides of the pressure sensitive adhesive double coated sheet 1 is sharply reduced.

Thereafter, the second table 6 is moved to the heat detaching unit 10, and stopped and locked at a given position opposite to the first table 16 as shown in FIG. 5. Upon locking of the second table 6, the rod 17 is extended downward with the gripping means held in the state of gripping the first table 16. Thus, the first table 16 is pushed downward with the result that the first table 16 is contacted with the upper surface of the glass plate A of the laminate unit C.

Upon contacting of the first table 16 with the laminate unit C, the laminate unit C is fixed by suction by the sucking means provided at the lower surface of the first table 16. Then, the gripping means coupling the first table 16 with the rod 17 is canceled so that the first table 16 is freed from the vertical movement of the rod 17. In this state, the downward gravity of the first table 16 substantially balances the upward tensile force of the elongated spring 22, so that there is substantially no load on the laminate unit C.

Figure 9:
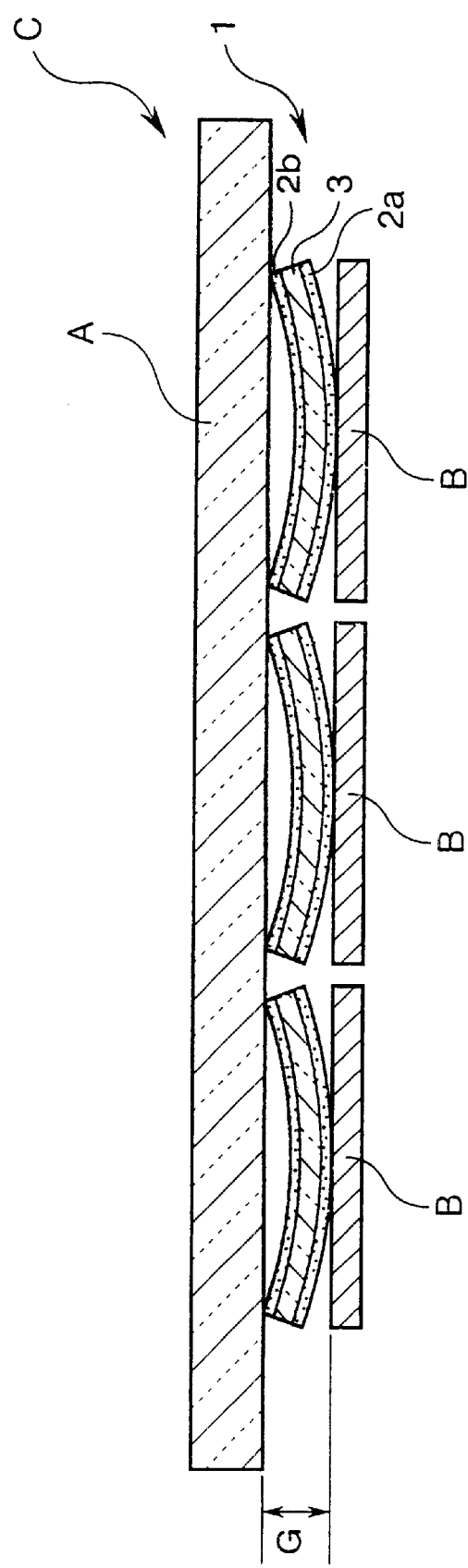
FIG. 9 is a sectional view of the laminate unit shown in FIG. 1 which is in detached condition.

Subsequently, the laminate unit C is heated by the heating means 7 provided in the first table 16 and the second table 6. As a result, the heat shrink base 3 of the pressure sensitive adhesive double coated sheet 1 is shrunk, thereby starting detachment of the laminate unit C as shown in FIG. 9. When the shrinkage of the pressure sensitive adhesive double coated sheet 1 is started, the force for deformation produced by the shrinkage is applied in such a direction that the distance between the glass plate A and the chip B is further increased. Since the gravity of the first table 16 balances the tensile strength of the spring 22, the force for deformation lifts the first table 16. Simultaneously, without being prevented by the gravity of the first table 16, the force for deformation advances the deformation of the pressure sensitive adhesive double coated sheet 1. Thus, the distance between the glass plate A and the chip B is increased, thereby finally forming gap G. As a result, the area of contact of the chip B with the pressure sensitive adhesive double coated sheet 1 is reduced, so that the chip B is apart from the pressure sensitive adhesive double coated sheet 1.

Upon judging of the termination of shrinkage and the completion of detachment, the first table 16 is coupled with the rod 17 once more by the gripping means provided in the rod 17. Thereafter, the sucking means of the first table 16 is canceled, and the first table 16 is retreated to an upward stand-by position.

The judging of the completion of detachment can be accomplished either by detecting whether or not the gap G has reached a given level with the use of a sensor or on the basis of the time for detachment completion that has been preset with the use of a timer.

After the completion of this step, clearance occurs at the interface of the pressure sensitive adhesive double coated sheet 1 and the glass plate A and at the interface of the pressure sensitive adhesive double coated sheet 1 and the chip B as shown in FIG. 9.

Thereafter, the laminate unit C is conveyed to the support plate unloader unit 11. In the support plate unloader unit 11, as shown in FIG. 6, the glass plate A is first attracted by the sucking means provided in the carrying arm 23. The attracted glass plate A is stored one by one in the support plate cassette 24 disposed outside the region of movement of the second table 6.

In the support plate unloader unit 11, as shown in FIG. 7, about when the glass plate A is slightly lifted, charged ionic wind is blown toward the clearance and simultaneously is sucked from the opposite side by fan 26 so that the residues of the pressure sensitive adhesive double coated sheet 1 can be collected in the dust box 28. Alternatively, the removal of residues of the pressure sensitive adhesive double coated sheet 1 may be accomplished by compressing a pressure sensitive adhesive tape to the residues and winding the pressure sensitive adhesive tape to which the residues are stuck.

The second table 6 is forwarded to the chip sorter unit 12 as shown in FIG. 8. In the chip sorter unit 12, the suction of the second table 6 is canceled. The chip B having been freed from the second table 6 is attracted by suction by means of the suction collet 31 of the pickup arm 30 while the position thereof is ascertained by the position camera 35. Then, the attracted chip B is conveyed to a given position of the chip tray 33 placed on the chip tray table. In this way, a plurality of chips can be controlled integrally.

Although, in this embodiment, the post-processing comprises storing the chip in the chip tray 33 and effecting integral control thereof, the chip may be directly transferred onto a substrate for chip mounting such as a lead frame, immediately followed by bonding and immobilization.

Figure 10:
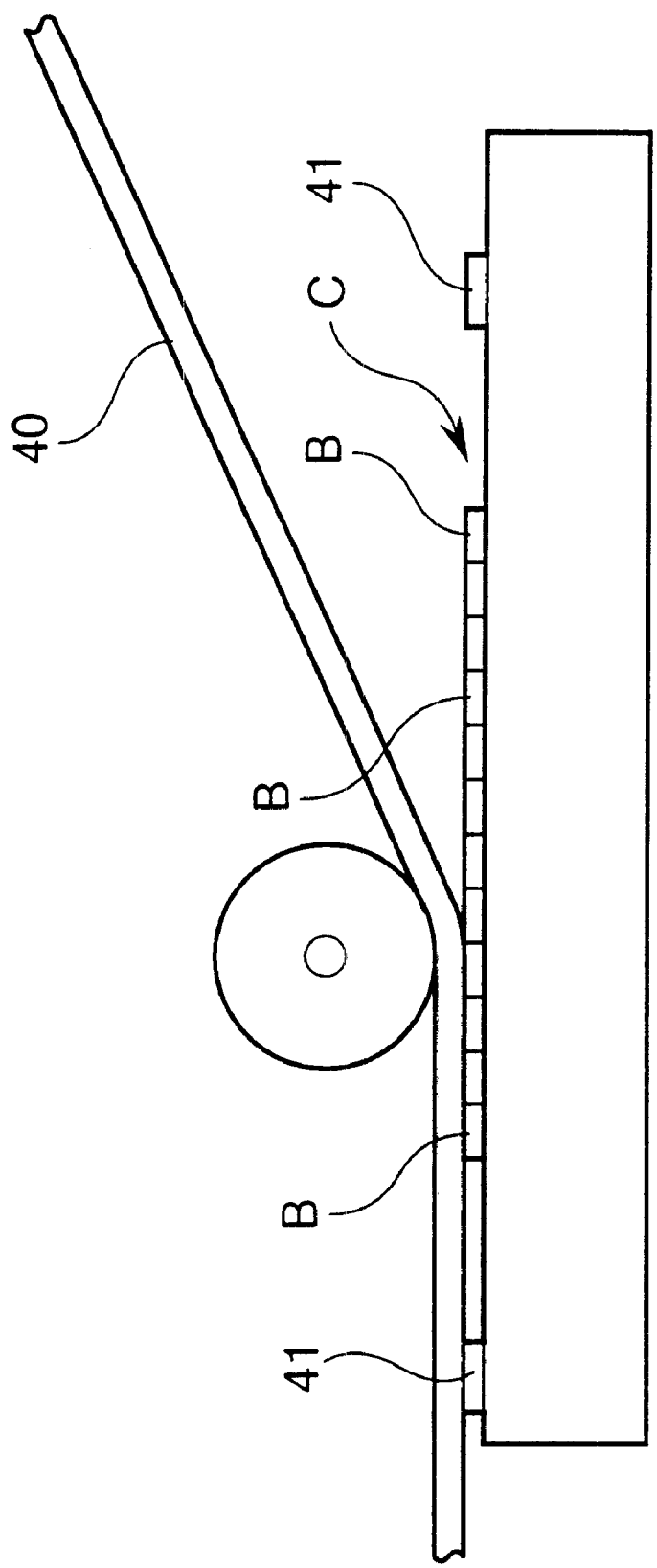
FIG. 10 is a schematic side view of a safekeeping tape being stuck to chips.

Moreover, in the chip sorter unit 12, in place of storing the chip in the chip tray 33, it is feasible, as shown in FIG. 10, chip is mounted on ring frame 41, while keeping the wafer configuration, with the use of safekeeping tape 40 after residues of the pressure sensitive adhesive double coated sheet 1 are removed therefrom and effect safekeeping of the chip in the state of being mounted on the ring frame 41. It is also feasible that chip is fixed only with the use of the safekeeping tape 40 without the use of the ring frame 41.

Furthermore, the safekeeping tape may be stuck to a chip surface after the dicing step as a prior step. In this use of the safekeeping tape, it is not needed to carry out individual chip processing immediately after the operation of detaching the chip from the support plate A, and the post-processing can be carried out in another occasion or another location.

As apparent from the above, the detachment apparatus of this embodiment enables detaching the chip fixed through the pressure sensitive adhesive double coated sheet without damaging on an automatic line.

The foregoing describes the detaching method and detachment apparatus according to one embodiment of the present invention, which in no way limits the scope of the present invention.

In the above embodiment, the chipped semiconductor wafer is used as an example of article. However, the article employed in the present invention is not limited thereto, and may be a nondivided semiconductor wafer. The detaching method and detachment apparatus according to the present invention are naturally applicable to other various articles fixed through a pressure sensitive adhesive double coated sheet.

As apparent from the foregoing, in the method of detaching an article fixed through a pressure sensitive adhesive double coated sheet according to the present invention, any of various articles can be temporarily held on a support plate and the articles can be fixed and protected and further required processing and protection can be carried out by the pressure sensitive adhesive double coated sheet and thereafter the pressure sensitive adhesive double coated sheet so used can be easily detached from the articles by simple operation. Even if the article which is a semiconductor wafer having its back ground until the semiconductor wafer comes to have an extremely small thickness can be easily detached from the pressure sensitive adhesive double coated sheet without being broken by the use of the method of the present invention.

The above detachment apparatus of the present invention enables carrying out the method of the present invention, irrespective of having a compact structure, and further enables avoiding, for example, a cleaning step. Therefore, the detachment apparatus of the present invention is suitable for installation in an automatic line.

What is claimed is:

1. A method of detaching an article fixed through a pressure sensitive adhesive double coated sheet, comprising the steps of:

holding a laminate unit, between a pair of sandwiching means, the sandwiching means so arranged as to enable interposition of the laminate unit, said laminate unit being obtained by fixing an article to a support plate through a pressure sensitive adhesive double coated sheet capable of being deformed by heating to thereby exert a detachment effect, wherein said sandwiching means includes means for balancing a force between said sandwiching means to provide a clearance space for the deformed pressure sensitive double coated sheet;

heating the laminate unit by heating means so that the pressure sensitive adhesive double coated sheet is deformed to thereby reduce an area of contact between the pressure sensitive adhesive double coated sheet and the article with the result that the article is apart from the pressure sensitive adhesive double coated sheet.

2. The method as claimed in claim 1, wherein said pair of sandwiching means comprises a first table and a second table.

3. The method as claimed in claim 1, wherein said pressure sensitive adhesive of at least one side of the pressure sensitive adhesive double coated sheet is composed of an ultraviolet curable pressure sensitive adhesive, and the support plate is permeable for ultraviolet rays; and wherein, prior to holding the laminate unit between the sandwiching means, the pressure sensitive adhesive double coated sheet is irradiated with ultraviolet rays having been passed through the support plate, so that the ultraviolet curable pressure sensitive adhesive has its adhesive strength reduced.

* * * * *